(12) United States Patent
Matsuwaki

(10) Patent No.: US 8,974,082 B2
(45) Date of Patent: Mar. 10, 2015

(54) ILLUMINATION DEVICE

(75) Inventor: Hiroshi Matsuwaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 19 days.

(21) Appl. No.: 13/808,927

(22) PCT Filed: Oct. 24, 2011

(86) PCT No.: PCT/JP2011/005923
§ 371 (c)(1),
(2), (4) Date: Jan. 8, 2013

(87) PCT Pub. No.: WO2012/056669
PCT Pub. Date: May 3, 2012

(65) Prior Publication Data
US 2013/0107535 A1  May 2, 2013

(30) Foreign Application Priority Data

Oct. 26, 2010 (JP) ................. 2010-239258

(51) Int. Cl.
*F21V 9/16* (2006.01)
*H01L 33/50* (2010.01)
(Continued)

(52) U.S. Cl.
CPC .............. *F21V 13/08* (2013.01); *F21V 29/004* (2013.01); *F21V 29/2231* (2013.01); *G03B 15/02* (2013.01); *H01L 33/642* (2013.01);
(Continued)

(58) Field of Classification Search
CPC .............. F21V 9/16; F21V 5/04; F21K 9/00; F21Y 2101/02; H01L 33/52; H01L 33/58; H01L 33/48; H01L 23/041

USPC ............ 362/84, 249.02, 311.02, 329; 257/98, 257/99, 100
See application file for complete search history.

(56) References Cited

U.S. PATENT DOCUMENTS 7,556,404 B2 * 7/2009 Nawashiro et al. ............ 362/293
7,687,823 B2 * 3/2010 Amo et al. ....................... 257/99
(Continued)

FOREIGN PATENT DOCUMENTS

JP 2000-089318 A 3/2000
JP 2005-114924 A 4/2005
(Continued)

OTHER PUBLICATIONS

International Search Report for Application No. PCT/JP2011/005923, dated Nov. 15, 2011, 2 pgs.

*Primary Examiner* — Peggy Neils
(74) *Attorney, Agent, or Firm* — RatnerPrestia

(57) ABSTRACT

An illumination device includes a point light source disposed on a base substrate, a package in which the point light source is sealed with a wavelength converter for converting a wavelength of light from the point light source, an optical member for controlling light from the package, a housing with an attachment face for holding the optical member and a bonding part for holding the package, and a circuit board on which the package is mounted. A space is provided between the wavelength converter and the optical member. The bonding part of the housing is directly positioned and fixed to a reference face of the package. This makes the heat generated from the LED chip released via the housing. Accordingly, a heat quantity transferred to the lens can be reduced.

7 Claims, 3 Drawing Sheets

(51) Int. Cl.
  *F21V 13/08*    (2006.01)
  *F21V 29/00*    (2006.01)
  *G03B 15/02*    (2006.01)
  *H01L 33/64*    (2010.01)
  *F21V 13/02*    (2006.01)
  *H04N 5/225*    (2006.01)
  *F21V 13/04*    (2006.01)
  *F21V 15/01*    (2006.01)
  *F21Y 101/02*   (2006.01)
  *H01L 33/58*    (2010.01)
  *F21V 7/00*     (2006.01)

(52) U.S. Cl.
  CPC ............. *F21V 13/02* (2013.01); *H04N 5/2256* (2013.01); *F21V 13/04* (2013.01); *F21V 15/011* (2013.01); *F21Y 2101/02* (2013.01); *G03B 2215/0567* (2013.01); *H01L 33/58* (2013.01); *F21V 7/0066* (2013.01)
  USPC ............... 362/249.02; 362/84; 362/311.02

(56) References Cited

U.S. PATENT DOCUMENTS

| | | | |
|---|---|---|---|
| 7,804,147 B2 * | 9/2010 | Tarsa et al. | 257/433 |
| 2004/0190304 A1 * | 9/2004 | Sugimoto et al. | 362/555 |
| 2005/0074233 A1 | 4/2005 | Seo | |
| 2005/0201109 A1 * | 9/2005 | Shimura | 362/382 |
| 2008/0054288 A1 * | 3/2008 | Harrah et al. | 257/99 |
| 2012/0018754 A1 * | 1/2012 | Lowes | 257/98 |

FOREIGN PATENT DOCUMENTS

| | | |
|---|---|---|
| JP | 2006-100687 A | 4/2006 |
| JP | 2006-310549 A | 11/2006 |
| JP | 2007-036044 A | 2/2007 |
| JP | 2007-080879 A | 3/2007 |
| JP | 2008-071954 | 3/2008 |
| JP | 2008-205395 | 9/2008 |
| WO | 2010/032169 | 3/2010 |

\* cited by examiner

US 8,974,082 B2

ILLUMINATION DEVICE

TECHNICAL FIELD

The present invention relates to illumination devices used for imaging equipment, such as a camera, employing an LED element as a point light source.

BACKGROUND ART

Recently, an illumination device using point light source, such as LED illumination device, has been used as diversifying light sources for indoor lighting fixtures including bulb lighting and fluorescent lighting and backlight of LCD televisions. The illumination device using point light source is also used for illuminating a subject at taking a picture with an inserted camera of a mobile phone, digital still camera (DSC), or camcorder. In addition to downsizing, higher lighting intensity close to an illumination device equipped with flashlight discharge tube, which is a conventional light source, is demanded for an LED illumination device built in DSC or camcorder that is downsized year by year.

A structure of the illumination device equipped with conventional LED element is described below with reference to FIG. 4. FIG. 4 is a sectional view of the conventional LED illumination device.

As shown in FIG. 4, conventional LED illumination device 27 includes multiple LED packages 21, printed circuit board 26, housing 25, and lens 23. (For example, see PTL 1.) Multiple LED packages 21 are attached to printed circuit board 26. Printed circuit board 26 is attached to the bottom of housing 25. Lens 23 for collecting light from LED packages 21 is attached to an upper part of housing 25. However, since printed circuit board 26 and lens 23 are attached via housing 25 in LED illumination device 27 of PTL 1, downsizing is difficult.

On the other hand, in a downsized LED illumination device, it is important to collect light to an illuminating range as much as possible and illuminate a subject with uniform light distribution. This increases the lighting intensity and achieves clear shooting.

However, to realize high lighting intensity or uniform light distribution, positional accuracy becomes necessary between components configuring the LED illumination device. Accordingly, requirement for positional accuracy of LED packages 21 and lens 23 becomes tough due to downsizing. The above LED illumination device to which LED packages 21 and lens 23 are attached via housing 25 has disadvantage with respect to accuracy because factors of dimensional variations increase. As a result, the above LED illumination device likely causes variations in optical characteristics, such as lighting intensity and light-distribution angle.

LED illumination device 39 that reduces variations in optical characteristics caused by positional accuracy is described with reference to FIG. 5. (For example, see PTL 2.) FIG. 5 is a sectional view of another conventional LED illumination device.

As shown in FIG. 5, conventional LED illumination device 39 includes LED package 31 including LED chip 33 that is a light source, base substrate 32, and transparent resin 38; and lens 34. LED chip 33 is attached to a top face of the bottom of concavity 32B in base substrate 32. Transparent resin 38 is configured by mixing wavelength-converting phosphor for converting a wavelength of light emitted from LED chip 33 and transparent resin, such as epoxy resin and silicone resin. LED package 31 is configured by filling transparent resin 38 into concavity 32B in base substrate 32 to seal LED chip 33.

Lens 34 is attached to an upper part of LED package 31 within a luminous area of LED package 31, and collects light emitted from LED chip 33.

Here, lens 34 is directly attached such that its positioning face 34A at the bottom edge of lens 34 touches reference face 32A at the top face around concavity 32B in base substrate 32 of LED package 31.

On the other hand, another method of increasing the lighting intensity in LED illumination device 39 is to increase the lighting current. However, it generates heat. In general, LED chip 33 has a characteristic that lower temperature results in higher efficiency of converting the current to light (luminous efficiency). Therefore, the luminous efficiency of LED chip 33 reduces and also operating life shortens as a temperature of LED chip 33 rises by increasing the lighting current. Furthermore, transparent resin 38 sealing LED chip 33 also discolors by thermal impact, and the light transmittance reduces. This reduces the lighting intensity of LED illumination device 39.

Therefore, high heat-release characteristics for reducing heat is required for LED illumination device 39 in order to prevent an impact on optical characteristics of the heat generated by illuminating LED chip 33.

However, in LED illumination device 39 shown in FIG. 5, lens 34 is directly attached to reference face 32A of base substrate 32 of LED package 31. Therefore, the entire incoming face of light of lens 34 touches base substrate 32 and transparent resin 38 of LED package 31. The heat generated from LED chip 33 is thus easily transferred to lens 34 via base substrate 32 and transparent resin 38. Here, if a current level applied to LED chip 33 is increased in order to increase the intensity of light from LED chip 33, a heat quantity generated from LED chip 33 also increases proportionately. A heat quantity transferred to lens 34 thus also increases proportionately. As a result, lens 34 thermally expands due to an impact of heat. For example, optical characteristics change by a minute change of shape. In addition, a change of shape of lens 34 deteriorates optical characteristics, such as reduction of lighting intensity and a change of light-distribution angle.

Still more, luminous efficiency of LED chip 33 in LED package 31 decreases as a temperature increases. Therefore, an amount of light reduces due to decreased luminous efficiency if LED chip 33 is used at high temperature for a long period. If the current level is further increased to gain necessary lighting intensity for LED illumination device 39, power consumption increases.

Furthermore, if LED chip 33 is continuously used at high temperature, thermal discoloration of transparent resin 8 used for sealing accelerates. As a result, transmittance of lens 34 reduces, and thus the lighting intensity of LED illumination device 39 reduces. This shortens the operating life.

LED illumination device 27 of PTL 1 described with reference to FIG. 4 has a structure unlikely affected by heat. However, optical characteristics, such as lighting intensity and light-distribution angle, may vary.

CITATION LIST

Patent Literature

PTL 1 Japanese Patent Unexamined Publication No. 2000-89318

PTL 2 Japanese Patent Unexamined Publication No. 2007-80879

SUMMARY OF THE INVENTION

To solve the above disadvantages, an illumination device of the present invention includes a point light source disposed on a base substrate, a package in which the point light source is sealed with a wavelength converter for converting a wavelength of light from the point light source, an optical member for controlling light from the package, a housing with an attachment face for holding the optical member and a bonding part for holding the package, and a circuit board on which the package is mounted. A space is provided between the wavelength converter and the optical member, and the bonding part of the housing is directly positioned and fixed to a reference face of the package.

This enables to release the heat generated from the LED chip via the housing, and thus heat quantity transferred to the lens can be reduced. As a result, the present invention offers the illumination device that can prevent deterioration of optical characteristics, such as lighting intensity and light-distribution control, of the light collected by the lens.

DESCRIPTION OF EMBODIMENTS

Exemplary embodiments of an illumination device of the present invention are described below with reference to drawings. It is apparent that the present invention is not limited in any way to the exemplary embodiments.
(First Exemplary Embodiment)

Figure 1:
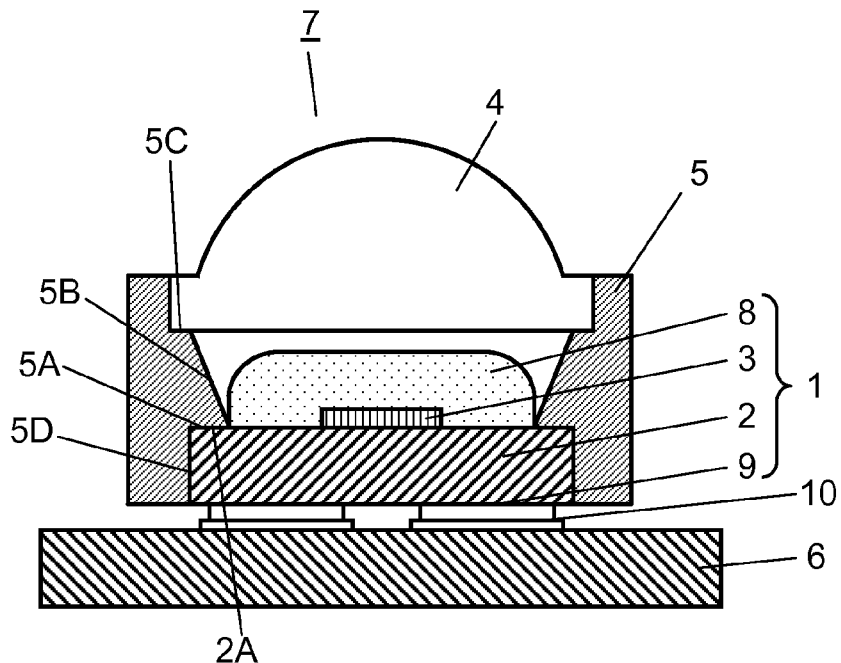
FIG. 1 is a sectional view of an illumination device in accordance with a first exemplary embodiment of the present invention.

FIG. 1 is a sectional view of an illumination device in accordance with the first exemplary embodiment of the present invention.

As shown in FIG. 1, illumination device 7 in the first exemplary embodiment of the present invention at least includes LED package 1, lens 4, housing 5, and circuit board 6. LED package 1 (hereafter referred to as a "package") includes base substrate 2, point light source 3 such as LED chip (hereafter referred to as "LED chip"), and transparent resin 8 that is a wavelength converter for covering LED chip 3. Base substrate 2 is configured with a material such as ceramic, and the LED chip, which is a light emitter of point light source 3, is mounted on base substrate 2. Transparent resin 8 is configured by mixing wavelength-converting phosphor for converting the wavelength of light emitted from LED chip 3 and transparent resin, such as epoxy resin and silicone resin. Transparent resin 8 functions as the wavelength converter. LED chip 3 is sealed by transparent resin 8. Electrode 9 made of a metal material with good conductivity, such as gold, is formed on a face of base substrate 2 opposite to the face where LED chip 3 is mounted. Circuit board 6 on which an electric circuit for controlling illumination device 7, such as a printed circuit board, is connected via electrode 9. LED chip 3 and electrode 9 are electrically connected by wiring (not illustrated).

Package 1 and circuit board 6 are disposed apart via solder layer 10, and are fixed by connecting electrode 9 of base substrate 2 of package 1 with a connector electrode (not illustrated) in circuit board 6. Therefore, package 1 and circuit board 6 do not directly touch. As a result, for example, an effect on variations in positional accuracy between components of package 1 can be reduced even if the thickness of solder layer 10 varies.

Housing 5 is typically configured with aluminum, and includes bonding part 5A for attaching package 1 and attachment face 5C for attaching lens 4. Reference face 2A for positioning is an area on a peripheral end of base substrate 2 of package 1 where transparent resin 8 is not formed. Package 1 and housing 5 are directly attached by reference face 2A and bonding part 5A of housing 5, using adhesive (not illustrated). Accordingly, package 1 and housing 5 are positioned and fixed.

Lens 4, which is an optical member, is configured with a transparent resin material, such as polycarbonate, acryl, and silicone. Lens 4 is molded to a predetermined shape (for example, a convex aspheric shape) using molds, and has predetermined optical performance. Lens 4 is typically inserted to stepped attachment face 5C formed on an upper inner face of housing 5, and fixed onto housing 5 by a side face of attachment face 5C, typically using adhesive (not illustrated). Here, a few grooves (not illustrated) are preferably formed on attachment face 5C of housing 5, and housing 5 and lens 4 are bonded by applying adhesive in the grooves. This prevents protrusion of adhesive, and can thus prevent an effect on optical refraction due to adhesive attached to an incoming face or outgoing face of light of lens 4.

A length of side face 5D of housing 5 in a direction along a side face of base substrate 2 is set to a length not touching circuit board 6.

Reflector shape 5B, such as a slope face, is formed on an inner wall (inner peripheral face) from bonding part 5A of housing 5 with base substrate 2 to attachment face 5C of lens 4. Reflector shape 5B broadens from bonding part 5A to attachment face 5C. This enables the light emitted from package 1 to reflect in a direction of lens 4 (in an optical axis direction of lens 4 as much as possible). As a result, the light emitted from LED chip 3 reliably enters lens 4 to emit light from lens 4 by collecting light as much as possible. This achieves illumination device 7 with high lighting intensity.

Still more, as shown in FIG. 1, a space is provided between transparent resin 8 covering LED chip 3 and a bottom face of lens 4 facing LED chip 3. This prevents transfer of heat generated in LED chip 3 to lens 4 via transparent resin 8.

As described above, illumination device 7 of the present invention releases the heat generated from LED chip 3 via housing 5. The heat quantity transferred to lens 4 can thus be reduced. Still more, since lens 4 and transparent resin 8 do not directly touch each other, the heat quantity transferred to lens 4 by heat transmission can be reduced. This can reduce an impact of heat on optical characteristics, such as lighting intensity and light-distribution control, of the light collected by lens 4. Furthermore, variations in positional accuracy between package 1 and lens 4 typically caused by variations in thickness of solder layer 10 fixing package 1 and circuit board 6, which occurs in the conventional LED illumination device, can be reduced.

The exemplary embodiment refers to aluminum as the material of housing 5. However, the present invention is not limited to this material. For example, other metal materials, such as copper and brass, or resin materials are applicable. If the housing is formed with a resin material, a material with high thermal conductivity, such as carbon filler, is preferably mixed in the resin material to improve the heat-release performance because the resin material has lower thermal conductivity compared to metal materials and thus the heat-release performance is not sufficient.

The exemplary embodiment also refers to the formation of a reflector-shaped slope on the inner wall of the housing. For example, metal deposition is preferably used for forming this slope. This achieves a mirror-like reflector-shaped slope, and thus reflectance can be improved. As a result, an illumination device with further better lighting intensity can be achieved.

(Second Exemplary Embodiment)

An illumination device in the second exemplary embodiment of the present invention is described below with reference to drawings.

Figure 2:
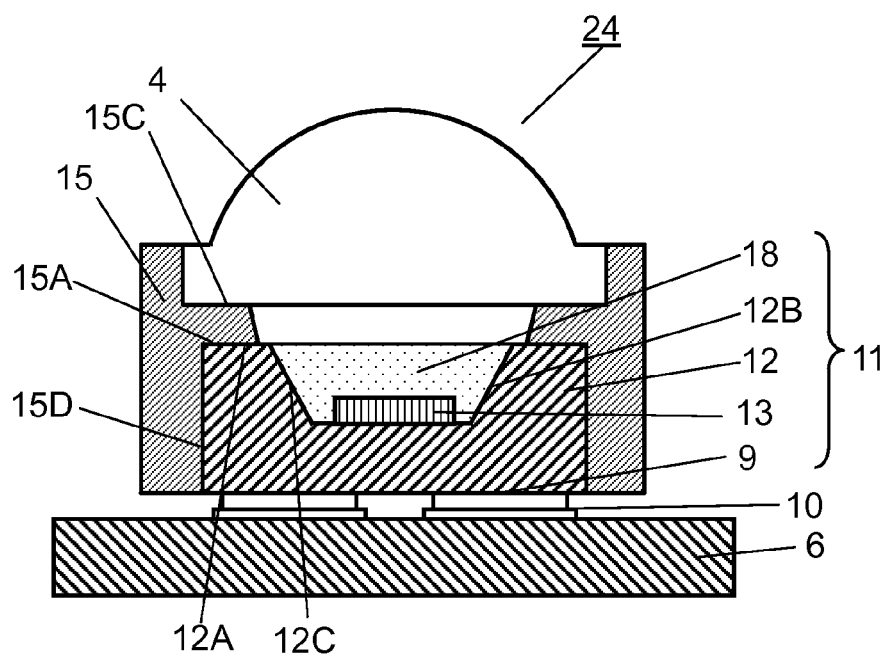
FIG. 2 is a sectional view of an illumination device in accordance with a second exemplary embodiment of the present invention.

FIG. 2 is a sectional view of the illumination device in accordance with the second exemplary embodiment of the present invention. A basic structure of illumination device 24 in this exemplary embodiment is the same as the illumination device in FIG. 1, and thus its description is omitted here.

More specifically, as shown in FIG. 2, the illumination device of the exemplary embodiment differs from the first exemplary embodiment in the next way. Concavity 12B is provided at the center of base substrate 12. LED chip 13 is disposed on a top face of the bottom of concavity 12B, and concavity 12B is sealed with transparent resin 18.

As shown in FIG. 2, illumination device 24 in this exemplary embodiment at least includes LED package 11, lens 4, housing 15, and circuit board 6. LED package 11 (hereafter referred to as "package") includes base substrate 12 with concavity 12B, LED chip 13 housed in concavity 12B, and transparent resin 18 covering LED chip 13 and filling concavity 12B.

Next is described positioning of housing 15, package 11, and lens 4 in the exemplary embodiment with reference to FIG. 2.

A cross section of housing 15 has an H shape in which a through hole is typically formed. Housing 15 includes bonding part 15A for attaching package 11 and attachment face 15C for attaching lens 4. Reference face 12A for positioning is a peripheral area of concavity 12B of base substrate 12 of package 11. Package 11 and housing 15 are directly attached using adhesive (not illustrated) at reference face 12A and bonding part 15A of housing 15. Accordingly, package 11 and housing 15 are positioned and fixed.

Lens 4 is inserted to stepped attachment face 15C formed on an upper inner face of housing 15. For example, lens 4 is fixed onto housing 15 at a side face of attachment face 15C, typically using adhesive (not illustrated).

A length of side face 15D of housing 15 in a direction along a side face of base substrate 12 is set to a length not making contact with circuit board 6.

Reflector shape 12C, such as a slope face, is formed on an inner wall (inner peripheral face) of concavity 12B. Reflector shape 12C broadens from a mounting face of LED chip 3 to attachment face 15C. This enables the light emitted from package 11 to reflect in a direction of lens 4 (in an optical axis direction of lens 4 as much as possible). As a result, the light emitted from LED chip 13 reliably enters lens 4 to emit light from lens 4 by collecting light as much as possible. This achieves illumination device 24 with high lighting intensity.

Still more, as shown in FIG. 2, a space is provided by the through hole in housing 15 between transparent resin 18 covering LED chip 13 and filling concavity 12B of base substrate 12 and a bottom face of lens 4 facing LED chip 13. This prevents transfer of heat generated in LED chip 13 to lens 4 via transparent resin 18.

As described above, illumination device 24 of the present invention releases the heat generated from LED chip 13 via housing 15. The heat quantity transferred to lens 4 can thus be reduced. Still more, since lens 4 and transparent resin 18 do not directly touch each other, the heat quantity transferred to lens 4 by heat transmission can be reduced. This can reduce an impact of heat on optical characteristics, such as lighting intensity and light-distribution control, of the light collected by lens 4. Furthermore, variations in positional accuracy between package 11 and lens 4, typically caused by variations in thickness of solder layer 10 fixing package 11 and circuit board 6, can be reduced.

The exemplary embodiment seals LED chip 13 by embedding transparent resin 18 in concavity 12B of base substrate 12. Accordingly, an amount of transparent resin 18 for sealing can be easily adjusted to increase the productivity. Furthermore, a converted wavelength can be accurately adjusted since the amount of transparent resin 18 can be easily adjusted by concavity 12B.

(Third Exemplary Embodiment)

An illumination device in the third exemplary embodiment of the present invention is described below with reference to drawings.

Figure 3:
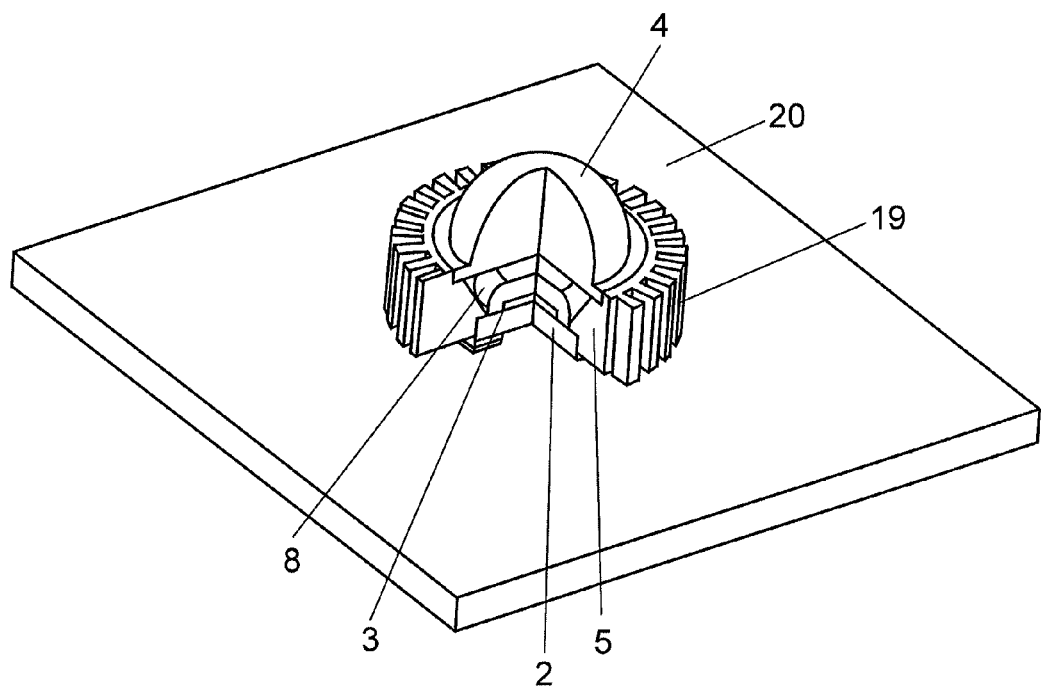
FIG. 3 is a cutaway perspective view of an illumination device in accordance with a third exemplary embodiment of the present invention.
Figure 4:
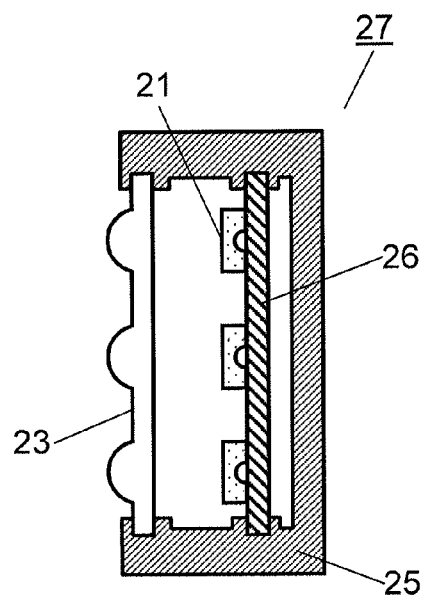
FIG. 4 is a sectional view of a conventional illumination device.
Figure 5:
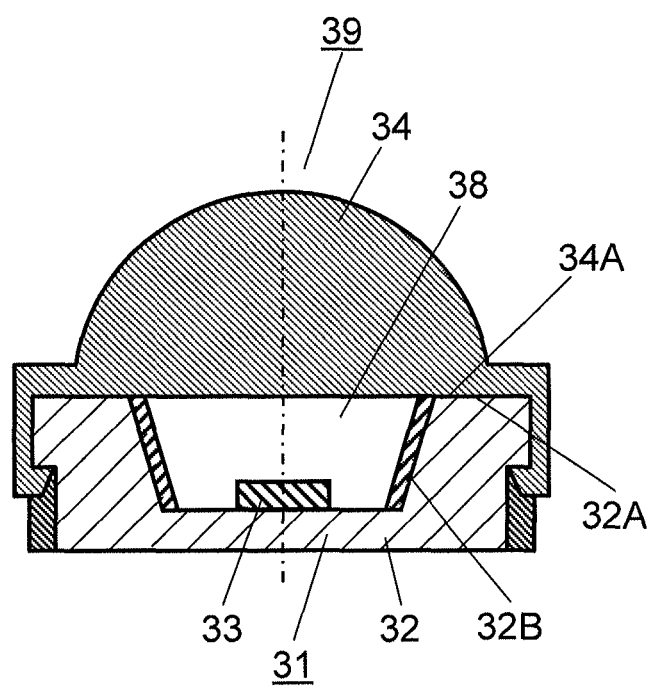
FIG. 5 is a sectional view of another conventional illumination device.

FIG. 3 is a cutaway perspective view of the illumination device in accordance with the third exemplary embodiment of the present invention. A basic structure of illumination device 20 in this exemplary embodiment is the same as the illumination device in FIG. 1, and thus its description is omitted here.

More specifically, as shown in FIG. 3, illumination device 20 in this exemplary embodiment differs from the first exemplary embodiment with respect to a point that multiple indented fins are provided on outer wall 19 of housing 5. A fin-like shape on outer wall 19 of housing 5 expands the surface area, and thus the heat-release performance can be drastically improved.

Here, the surface of fin-like outer wall 19 is preferably colored by alumite treatment or black paint. This improves emissivity of the surface of outer wall 19, and thus further improves the heat release performance.

Since the heat generated from LED chip 3 is transferred to housing 5, and is effectively released by fin-like outer wall 19 in this exemplary embodiment, the heat quantity transferred to lens 4 can be further reduced. This can further reduce an impact of heat on optical characteristics, such as lighting intensity and light-distribution control, of the light collected by lens 4.

As described above, each exemplary embodiment can suppress a temperature rise of the LED chip even if the lighting current is increased to achieve high lighting intensity for the illumination device. Accordingly, reduction of luminous efficiency and reduction of lighting intensity can be prevented.

Still more, each exemplary embodiment can delay deterioration of transmittance of transparent resin sealing the LED chip since the temperature rise of the LED chip can be suppressed. As a result, the life of illumination device affected by deterioration of lighting intensity can be lengthened.

Still more, the housing is directly attached to the package in each exemplary embodiment. This eliminates variations in the thickness of the solder layer used for connecting the base substrate and the printed circuit board, which cause positional variations. As a result, variations in a distance between the package and lens can be reduced. Accordingly, an impact of variations on optical characteristics, such as lighting intensity and light-distribution angle, can be reduced.

Still more, a space is provided between the lens and package by attaching the package to the housing in each exemplary embodiment. For example, an air layer can be provided using this space. As a result, lens design flexibility improves, and a high heat-insulating effect between the light-emitting face of the package and the incoming face of light of the lens can be achieved.

The illumination device of the present invention includes the point light source disposed on the base substrate, the package in which the point light source is sealed with a wavelength converter that converts the wavelength of light from the point light source, the optical member for controlling light from the package, the housing with the attachment face for holding the optical member and the bonding part for holding the package, and the circuit board on which the package is mounted. A space is provided between the wavelength converter and the optical member, and the bonding part of the housing is directly positioned and fixed to the reference face of the package.

This enables to release the heat generated from the LED chip via housing 5, and thus a quantity of heat transferred to the lens can be reduced. As a result, the present invention offers the illumination device that can prevent deterioration of optical characteristics, such as lighting intensity and light-distribution control, of the light collected by the lens.

Still more, fins are provided on the outer wall of the housing in the illumination device of the present invention. This further improves the heat-releasing effect.

Still more, the inner wall of the housing has the reflector shape in the illumination device of the present invention. This increases the amount of light output to the front by collecting light from the LED chip.

INDUSTRIAL APPLICABILITY

The illumination device of the present invention reduces an impact of heat generated in the package on optical characteristics. Accordingly, the present invention is effectively applicable to LED lights for illuminating a subject in mobile phones with camera, DSCs, and camcorders.

REFERENCE MARKS IN THE DRAWINGS 1, 11, 21, 31 Package (LED package)
2, 12, 32 Base substrate
2A, 12A, 32A Reference face
3, 13, 33 LED chip (point light source)
4, 23, 34 Lens (optical member)
5, 15, 25 Housing
5A, 15A Bonding part
5B, 12C Reflector shape
5C, 15C Attachment face
5D, 15D Side face
6 Circuit board
7, 24, 20 Illumination device
8, 18, 38 Transparent resin (wavelength converter)
9 Electrode
10 Solder layer
12B, 32B Concavity
19 Outer wall
26 Printed circuit board
27, 39 LED illumination device
34A Positioning face

The invention claimed is:

1. An illumination device comprising:
a point light source disposed on a base substrate;
a package in which the point light source is sealed with a wavelength converter for converting a wavelength of light from the point light source;
an optical member for controlling light from the package;
a housing including an attachment face for holding the optical member and a bonding part for holding the package; and
a circuit board on which the package is mounted;
wherein
a space is provided between the wavelength converter and the optical member, and
a face of the package where the housing is attached is defined as a reference face, and the bonding part of the housing is directly positioned and fixed to the reference face,
wherein the housing is above the circuit board with a space therebetween.

2. The illumination device of claim 1, wherein a concavity is provided in the base substrate, and the point light source is disposed in the concavity.

3. The illumination device of claim 1, wherein an outer wall of the housing has a fin shape.

4. The illumination device of claim 1, wherein an inner wall of the housing has a reflector shape.

5. The illumination device of claim 2, wherein an inner wall of the concavity in the base substrate has a reflector shape.

6. The illumination device of claim 1, wherein the reference face is a face on a periphery of the base substrate where the wavelength converter is not formed.

7. The illumination device of claim 1, wherein the package and the circuit board are spaced from each other.

* * * * *